US010291185B2

(12) United States Patent
Lyalin et al.

(10) Patent No.: US 10,291,185 B2
(45) Date of Patent: May 14, 2019

(54) DOHERTY POWER AMPLIFIERS WITH DIFFERENT OPERATING BIASES

(71) Applicant: SKYWORKS SOLUTIONS, INC., Woburn, MA (US)

(72) Inventors: Aleksey A. Lyalin, Moorpark, CA (US); Russ Alan Reisner, Newbury Park, CA (US); Ramon Antonio Beltran Lizarraga, Thousand Oaks, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/913,896

(22) Filed: Mar. 6, 2018

(65) Prior Publication Data
US 2018/0262162 A1 Sep. 13, 2018

Related U.S. Application Data

(63) Continuation of application No. 14/797,275, filed on Jul. 13, 2015, now Pat. No. 9,912,298.
(Continued)

(51) Int. Cl.
*H03F 3/68* (2006.01)
*H03F 1/02* (2006.01)
(Continued)

(52) U.S. Cl.
CPC .............. *H03F 1/0288* (2013.01); *H03F 1/32* (2013.01); *H03F 1/3282* (2013.01); *H03F 3/19* (2013.01);
(Continued)

(58) Field of Classification Search
CPC .......... H03F 5/00; H03F 3/45475; H03F 3/44; H03F 3/28; H03F 3/602; H03F 7/02;
(Continued)

(56) References Cited

U.S. PATENT DOCUMENTS

2004/0145416 A1* 7/2004 Kwon .................. H03F 1/0205
330/295
2012/0231753 A1* 9/2012 Maslennikov ........ H03F 1/0288
455/249.1
2015/0116039 A1* 4/2015 Ahmed ................. H03F 1/0233
330/295

OTHER PUBLICATIONS

Press Release 2013, "Sumitomo Electric Develops High-Efficiency Broadband Power Amplifier Compliant with Next Generation Mobile Communication Standards", Sumitomo Electric Industries, Ltd., Feb. 4, 2013.*

(Continued)

*Primary Examiner* — Steven J Mottola
*Assistant Examiner* — Hafizur Rahman
(74) *Attorney, Agent, or Firm* — Chang & Hale LLP

(57) ABSTRACT

Systems and methods related to linear load modulated power amplifiers. A power amplifier (PA) system can include a divider that splits a signal into two portions, a first portion directed to an attenuator that attenuates the first portion so that the first portion and the second portion have different powers and a second portion directed to a phase shift component that shifts a phase of the second portion so that the first portion and the second portion have different phases. The PA system can also include a Doherty amplifier circuit where a carrier amplifier amplifies the attenuated first portion and a peaking amplifier amplifies the phase-shifted second portion. The carrier amplifier includes a Class AB driver stage and a Class B output. The peaking amplifier includes a Class B driver stage a Class B output stage.

20 Claims, 16 Drawing Sheets

Related U.S. Application Data

(60) Provisional application No. 61/992,844, filed on May 13, 2014.

(51) Int. Cl.
*H03F 1/32* (2006.01)
*H03F 3/19* (2006.01)

(52) U.S. Cl.
CPC .. *H03F 2200/411* (2013.01); *H03F 2200/451* (2013.01)

(58) Field of Classification Search
CPC .......... H03F 3/45085; H03F 3/26; H03F 1/14; H03F 3/21; H03F 2200/372; H03G 1/0023; H03G 1/0088; H01L 2924/3011
USPC ... 330/3, 69, 74, 116, 117, 124 R, 134, 252, 330/254, 262, 275, 284, 292, 295, 301, 330/307
See application file for complete search history.

(56) References Cited

OTHER PUBLICATIONS

Anaren Application Note, "Design Considerations for surface mount Couplers", Feb. 25, 2011 , pp. 1-5.*
Moon et al. "Efficiency Enhancement of Doherty Amplifier by Mitigating the Knee Voltage Effect", IEEE Transactions on Microwave Theory and Techniques, vol. 59, No. 1, Jan. 2011.*
Asghari, "Comparison of different driver topologies for RF Doherty Power Amplifiers", MS Thesis, Chalmers, Sweden 2015, pp. 1-6.*

* cited by examiner

DOHERTY POWER AMPLIFIERS WITH DIFFERENT OPERATING BIASES

CROSS-REFERENCE TO RELATED APPLICATION(S)

This application is a continuation of U.S. patent application Ser. No. 14/797,275 filed Jul. 13, 2015 and entitled SYSTEMS AND METHODS RELATED LINEAR LOAD MODULATED POWER AMPLIFIERS, which claims priority to U.S. Provisional Application No. 61/992,844 filed May 13, 2014, entitled SYSTEMS AND METHODS RELATED TO LINEAR LOAD MODULATED POWER AMPLIFIERS, the disclosure of each of which is hereby expressly incorporated by reference herein in its entirety.

BACKGROUND

Field

The present disclosure generally relates to radio-frequency (RF) power amplifiers (PAs).

Description of the Related Art

Traditionally, it has been widely believed that the Doherty PA was not suitable for linear PA applications in handsets due to the size, complexity, and non-linear behavior. In fact, in base station applications, predistortion linearizers are typically used with Doherty PAs to meet linearity requirements. As described herein, issues such as size, complexity, and linearity associated with Doherty PAs can be addressed appropriately.

SUMMARY

In accordance with some implementations, the present disclosure relates to a power amplifier (PA) system including an input circuit configured to receive a radio-frequency (RF) signal and split the RF signal into a first portion and a second portion. The PA system further includes a Doherty amplifier circuit including a carrier amplifier coupled to the input circuit to receive the first portion and a peaking amplifier coupled to the input circuit to receive the second portion. The first portion and the second portion having different phases and different powers. The PA system further includes an output circuit coupled to the Doherty amplifier circuit. The output circuit is configured to combine outputs of the carrier amplifier and the peaking amplifier to yield an amplified RF signal.

In some embodiments, the input circuit can include a phase-shifter configured to cause the first portion and the second portion to have different phases. In some embodiments, the phase-shifter and peaking amplifier can be implemented in a peaking amplification path. In some embodiments, the first portion and second portion can be out-of-phase by between 10 degrees and 20 degrees. In some embodiments, the different phases can reduce at least one of AM/AM distortion or AM/PM distortion as compared to equal phases.

In some embodiments, the input circuit can include an attenuator configured to cause the first portion and the second portion to have different powers. In some embodiments, the attenuator and the carrier amplifier can be implemented in a carrier amplification path. In some embodiments, the different powers can reduce at least one of AM/AM distortion or AM/PM distortion as compared to equal powers.

In some embodiments, the input circuit can include a pre-driver amplifier.

In some embodiments, the peaking amplifier includes a driver stage configured to operate in a first biasing mode and an output stage configured to operate in a first biasing mode. In some embodiments, the first biasing mode is a Class B biasing mode. In some embodiments, the Class B biasing mode increases the PAE of the peaking amplifier as compared to a Class AB biasing mode. In some embodiments, the carrier amplifier includes a driver stage configured to operate in a second biasing mode. In some embodiments, the second biasing mode is a Class AB biasing mode. In some embodiments, the carrier amplifier further includes an output stage configured to operate in the first biasing mode. In some embodiments, the carrier amplifier further includes an output stage configured to operate in the second biasing mode.

In some implementations, the present disclosure relates to a power amplifier (PA) module. The PA module includes a packaging substrate configured to receive a plurality of components and a PA system implemented on the packaging substrate. The PA system includes an input circuit configured to receive a radio-frequency (RF) signal and split the RF signal into a first portion and a second portion. The PA system further includes a Doherty amplifier circuit including a carrier amplifier coupled to the input circuit to receive the first portion and a peaking amplifier coupled to the input circuit to receive the second portion. The first portion and the second portion have different phases and different powers. The PA system further includes an output circuit coupled to the Doherty amplifier circuit. The output circuit is configured to combine outputs of the carrier amplifier and the peaking amplifier to yield an amplified RF signal.

In some embodiments, at least one of the input circuit or the output circuit can be implemented as an integrated passive device. In some embodiments, at least one of the input circuit or the output circuit can be implemented on a single GaAs die.

In some implementations, the present disclosure relates to a wireless device. The wireless device includes a transceiver configured to generate a radio-frequency (RF) signal. The wireless device includes a power amplifier (PA) module in communication with the transceiver. The PA module includes an input circuit configured to receive the RF signal and split the RF signal into a first portion and a second portion. The PA module includes a Doherty amplifier circuit including a carrier amplifier coupled to the input circuit to receive the first portion and a peaking amplifier coupled to the input circuit to receive the second portion. The first portion and the second portion have different phases and different powers. The PA module includes an output circuit coupled to the Doherty amplifier circuit. The output circuit is configured to combine outputs of the carrier amplifier and the peaking amplifier to yield an amplified RF signal. The wireless device further includes an antenna in communication with the PA module. The antenna is configured to facilitate transmission of the amplified RF signal.

In some implementations, the present disclosure relates to a method for amplifying a radio-frequency (RF) signal. The method includes providing a Doherty amplifier circuit having a carrier amplification path and a peaking amplification path, receiving an RF signal, splitting the RF signal into a first portion and a second portion, the first portion provided to the carrier amplification path, the second portion provided to the peaking amplification path, the first portion and the second portion having different phases and different powers, and combining an output of the carrier amplification path and an output of the peaking amplification path to yield an amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/797,254 (now U.S. Pat. No. 9,450,541) filed Jul. 13, 2015 and entitled SYSTEMS AND METHODS RELATED TO LINEAR AND EFFICIENT BROADBAND POWER AMPLIFIERS, and U.S. patent application Ser. No. 14/797,261 (now U.S. Pat. No. 9,467,115) filed Jul. 13, 2015 and entitled CIRCUITS, DEVICES AND METHODS RELATED TO COMBINERS FOR DOHERTY POWER AMPLIFIERS, each of which is hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Disclosed are various examples related to Doherty power amplifier (PA) applications, such as those for high peak to average power ratio (PAPR) 4G modulation signals used in 3G and 4G handset applications. In some embodiments, by utilizing the Doherty approach over other designs, up to 10% higher peak power added efficiency (PAE) levels can be achieved for the same adjacent power level ratio (ACLR) levels. Such PAE performance can match that of an envelope tracking (ET) PA for much less overall system complexity.

Traditionally, it has been widely believed that the Doherty PA was not suitable for linear PA applications in handsets due to the size, complexity, and non-linear behavior. In fact, in base station applications, predistortion linearizers are typically used with Doherty PAs to meet linearity requirements. As described herein, issues such as size, complexity, and linearity associated with Doherty PAs can be addressed appropriately.

Figure 1:
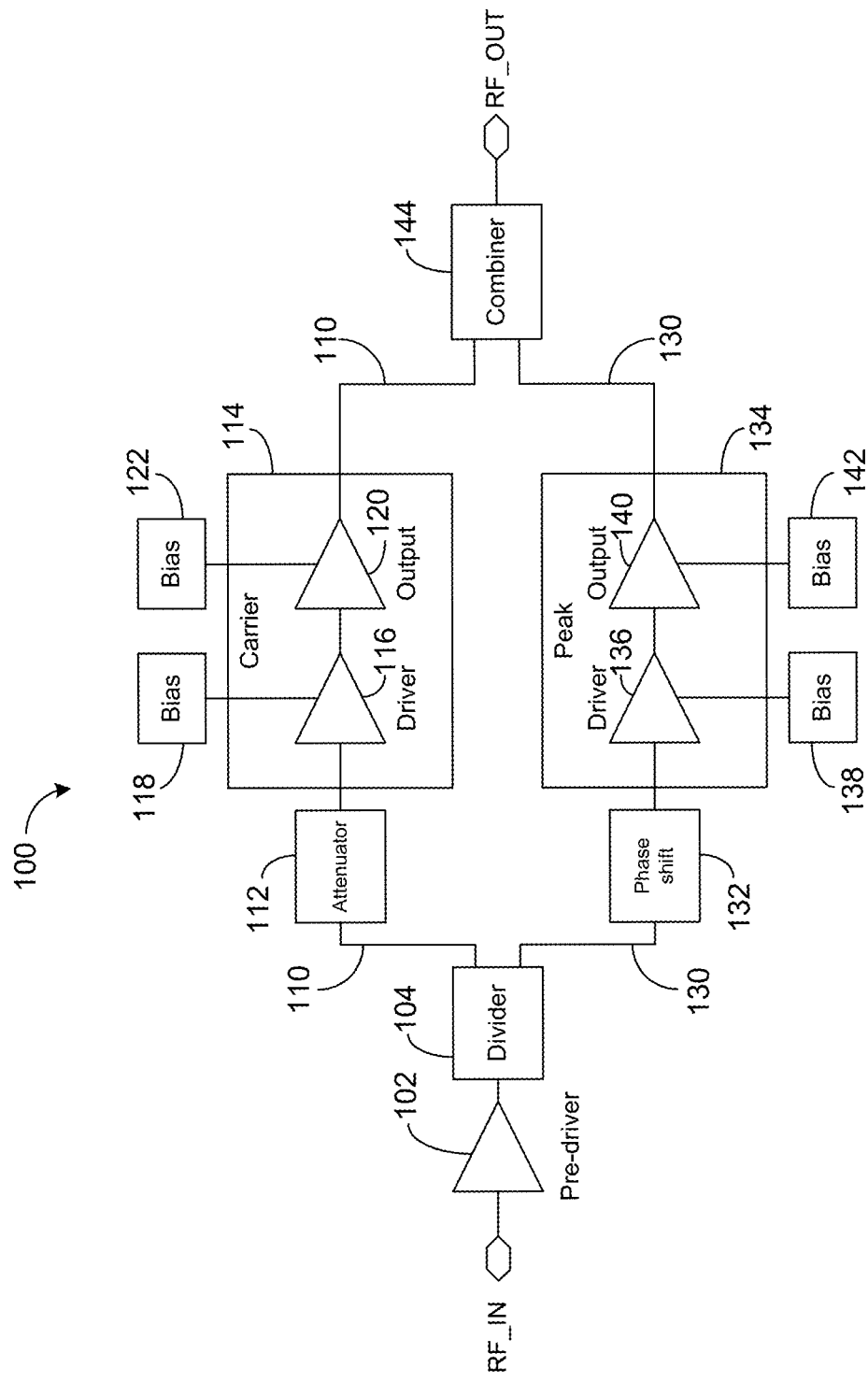
FIG. 1 shows an example architecture of a power amplifier (PA) having one or more features as described herein.

FIG. 1 shows an example architecture of a PA 100 having one or more features as described herein. The architecture shown is a Doherty PA architecture. Although the various examples are described in the context of such a Doherty PA architecture, it will be understood that one or more features of the present disclosure can also be implemented in other types of PA systems.

The example PA 100 is shown to include an input port (RF_IN) for receiving an RF signal to be amplified. Such an input RF signal can be partially amplified by a pre-driver amplifier 102 before being divided into a carrier amplification path 110 and a peaking amplification path 130. Such a division can be achieved by a divider 104. Examples related to the divider 104 (also referred to herein as a splitter or a power splitter) are described herein in greater detail.

In FIG. 1, the carrier amplification path 110 is shown to include an attenuator 112 and amplification stages collectively indicated as 114. The amplification stages 114 are shown to include a driver stage 116 and an output stage 120. The driver stage 116 is shown to be biased by a bias circuit 118, and the output stage 120 is shown to be biased by a bias circuit 122. In some embodiments, there may be more or less number of amplification stages. In various examples described herein, the amplification stages 114 are sometimes described as an amplifier; however, it will be understood that such an amplifier can include one or more stages.

In FIG. 1, the peaking amplification path 130 is shown to include phase shifting circuit 132 and amplification stages collectively indicated as 134. The amplification stages 134 are shown to include a driver stage 136 and an output stage 140. The driver stage 136 is shown to be biased by a bias circuit 138, and the output stage 140 is shown to be biased by a bias circuit 142. In some embodiments, there may be more or less number of amplification stages. In various examples described herein, the amplification stages 134 are sometimes described as an amplifier; however, it will be understood that such an amplifier can include one or more stages.

FIG. 1 further shows that the carrier amplification path 110 and the peaking amplification path 130 can be combined by a combiner 144 so as to yield an amplified RF signal at an output port (RF_OUT). Examples related to the combiner 144 are described herein in greater detail.

Figure 2:
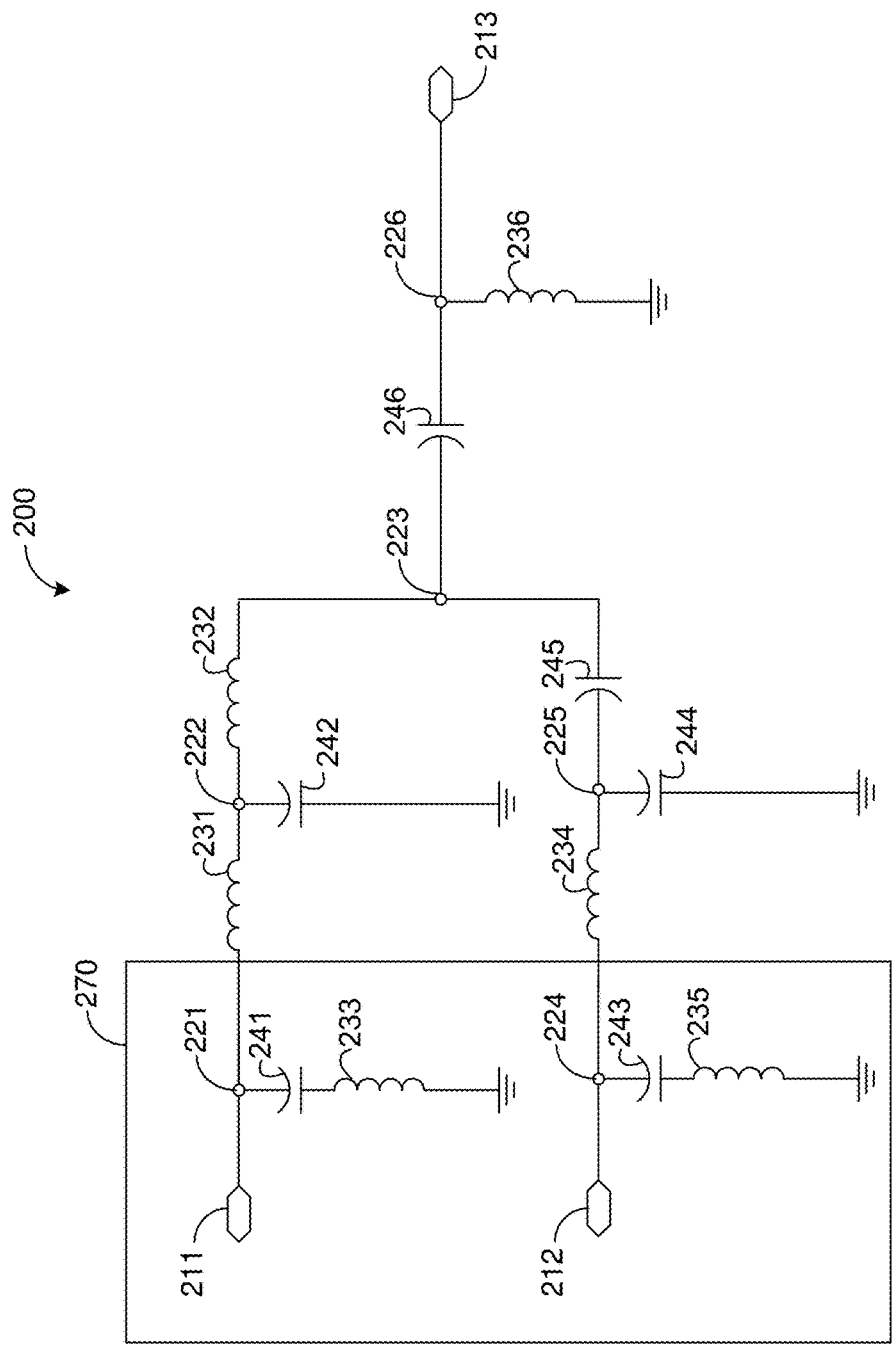
FIG. 2 shows an example of a combiner circuit for a Doherty PA.

FIG. 2 shows an example of a combiner circuit for a Doherty PA. Such a combiner can be configured to provide moderate bandwidth performance. In FIG. 2, peaking amplifier signal and carrier amplifier signal are shown to be received from their respective collectors (not shown) and combined so as to yield an output that can be provided to, for example, a duplexer. In FIG. 2, impedance values, as well as values of various capacitance and inductance elements, are examples; and it will be understood that other values can also be implemented.

The combiner 200 includes a first input port 211 (which may receive a peaking amplifier signal), a second input port 212 (which may receive a carrier amplifier signal), and an output port 213 that provides a combination of the signals received at the first input port 211 and the second input port 212.

The first input port 211 is coupled to a first node 211. The first node 221 is further coupled to ground (via a first capacitor 241 and a third inductor 233) and to a second node 222 (via a first inductor 231). The second node 222 is coupled to ground (via a second capacitor 242) and a third node 223 (via a second inductor 232).

The second input port 212 is coupled to a fourth node 224. The fourth node is further coupled to ground (via a third capacitor 243 and a fifth inductor 235) and to a fifth node 225 (via a fourth inductor 234). The fifth node 225 is coupled to ground (via a fourth capacitor 244) and the third node 223 (via a fifth capacitor 245).

The output port 213 is coupled to a sixth node 226. The sixth node 226 is further coupled to ground (via a sixth inductor 236) and the third node 223 (via a sixth capacitor 246).

The first input port 211, second input port 212, the first capacitor 241, the third inductor 233, the third capacitor 243, and the fifth inductor 235 may be implemented as an integrated passive device (IPD). In some embodiments, the components may be implemented on a single GaAs die 270.

The presented impedance at the second node 222 and the fifth node 225 may each be 25 Ohms. The presented impedance at the third node 223 may be 12.5 Ohms.

Figure 3:
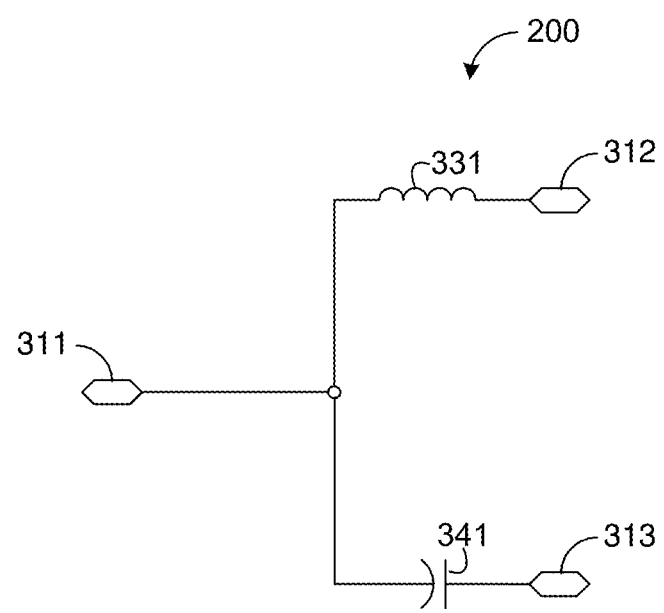
FIG. 3 shows an example of a splitter circuit for a Doherty PA.

FIG. 3 shows an example of a power splitter circuit for a Doherty PA. Such a splitter can be utilized with the example combiner of FIG. 2, and be configured to provide moderate bandwidth performance. In FIG. 3, an input radio-frequency (RF) signal is shown to be received at input 311 and be split into two paths. The first path can be coupled to a peaking PA at the first output 312, and the second path can be coupled to a carrier PA at the second output 313. Along the first path lies an inductor 331 and along the second path lies a capacitor 341. In FIG. 3, values of various capacitance and inductance elements, are examples; and it will be understood that other values can also be implemented.

Figure 4:
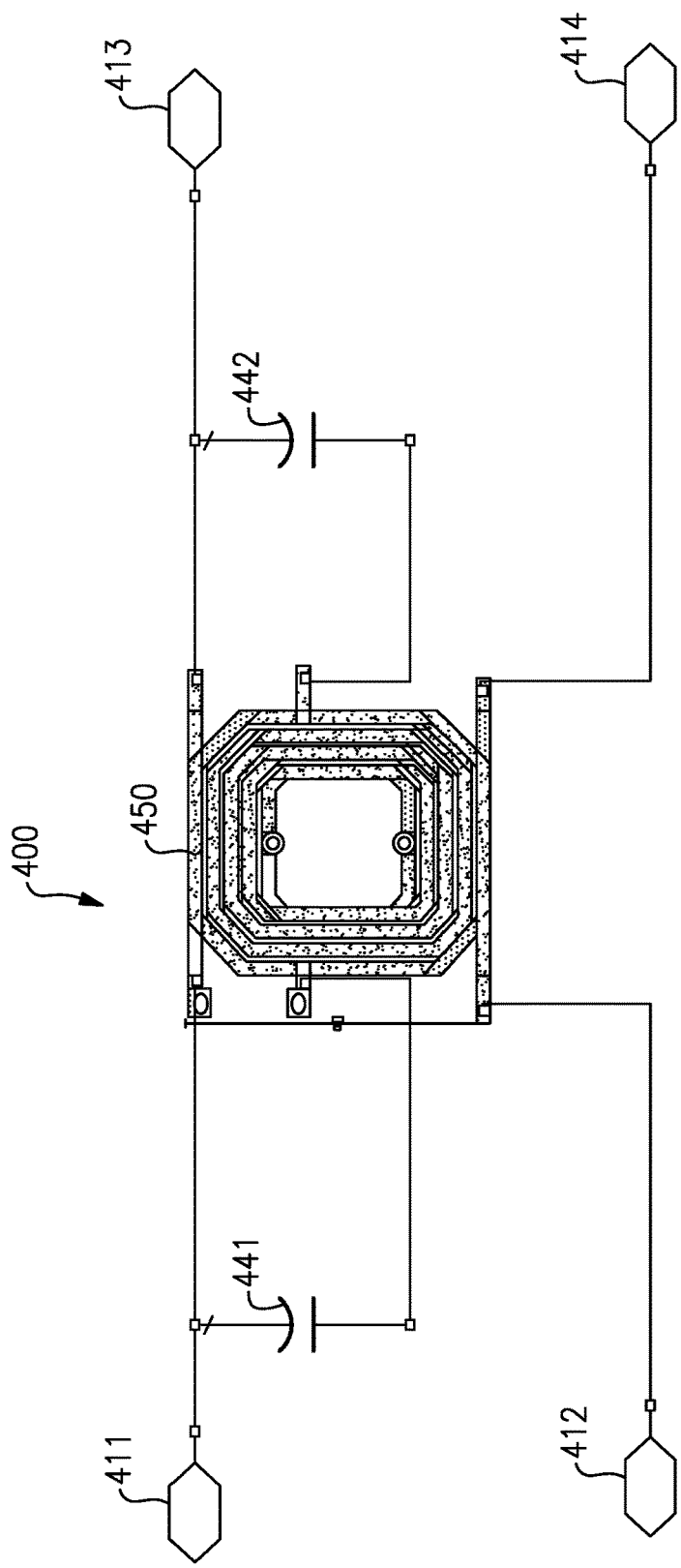
FIG. 4 shows an example of a power splitter that can be utilized as the divider of FIG. 1.

FIG. 4 shows an example of a power splitter 400 that can be utilized as the divider 104 of FIG. 1. In FIG. 4, the power splitter 400 includes a transformer 450 with two coils positioned relative to each other. The first coil can have interleaved windings that are coupled to each other, with one winding being coupled to an input 411 and the other winding being coupled to a first output 414. The second coil can have interleaved windings that are coupled to each other, with one winding being coupled to an isolation port 412 and the other winding being coupled to a second output 413.

The example of FIG. 4 can be configured as a quadrature splitter having broadband capability. Such a splitter can be configured as a semi-lumped 90 degree power divider that can be implemented as IPD design for low frequencies and also as an integrated divider on GaAs die for higher frequencies.

The power splitter 400 can further include capacitors 441, 442 coupling the coils. In some embodiments, a first capacitor 441 is coupled between the input 411 and the isolation port 412 and a second capacitor 442 is coupled between the first output 413 and the second output 414.

With the foregoing configuration, power of an RF signal received at the input port can be split into the two output ports 413, 414. Such split signals can be provided to the carrier amplifier and peaking amplifier of FIG. 1.

Figure 5:
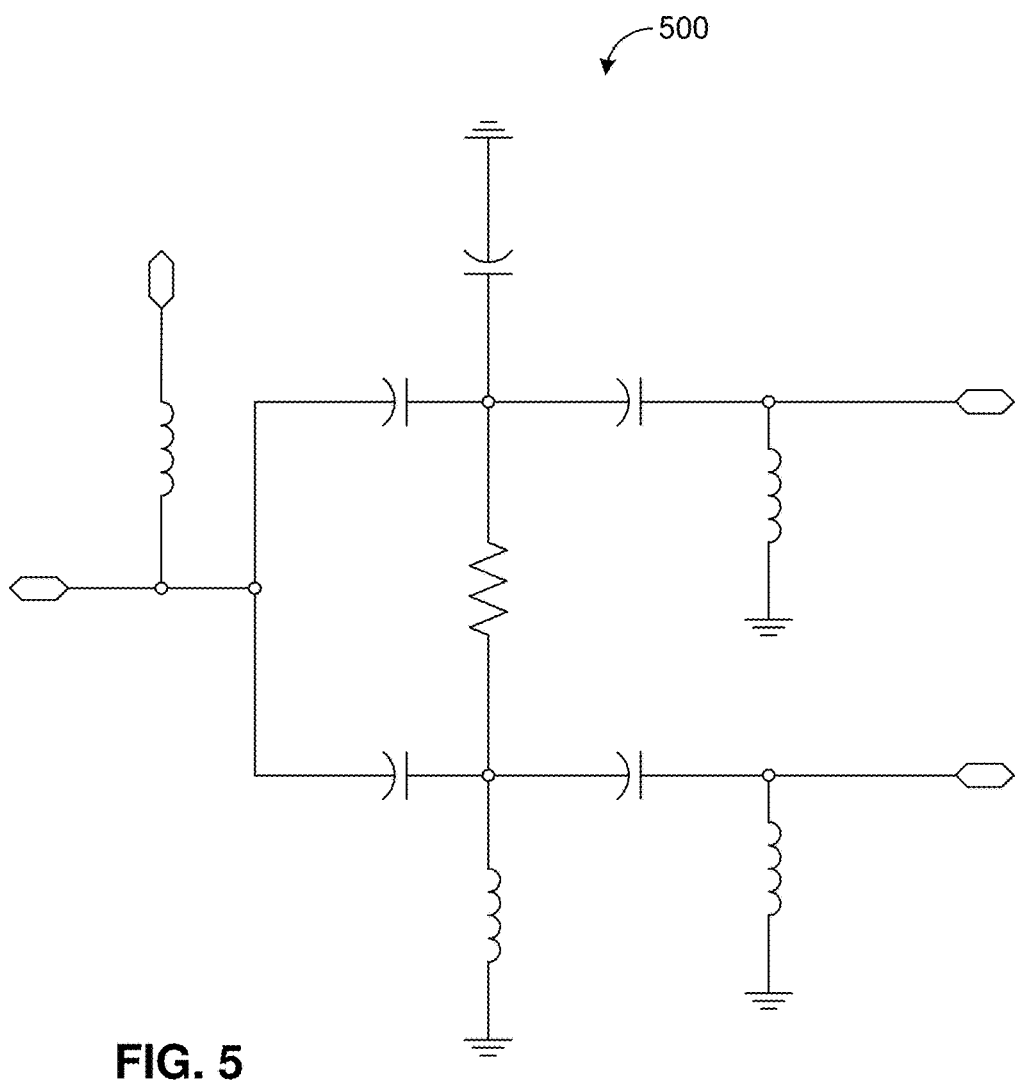
FIG. 5 shows another example of a power splitter that can be utilized as the divider of FIG. 1.

FIG. 5 shows an example of a power splitter 500 that can be utilized as the divider 104 of FIG. 1. Additional details concerning such a power splitter are described in U.S. patent application Ser. No. 14/797,254, entitled SYSTEMS AND METHODS RELATED TO LINEAR AND EFFICIENT BROADBAND POWER AMPLIFIERS.

The example of FIG. 5 can be configured as a quadrature splitter having broadband capability. In some embodiments, such a splitter can be configured as a lumped 90 degree power divider that can be implemented as an SMT circuit for low frequencies, and also as an integrated (e.g., IPD) divider on GaAs die for higher frequencies.

Figure 6:
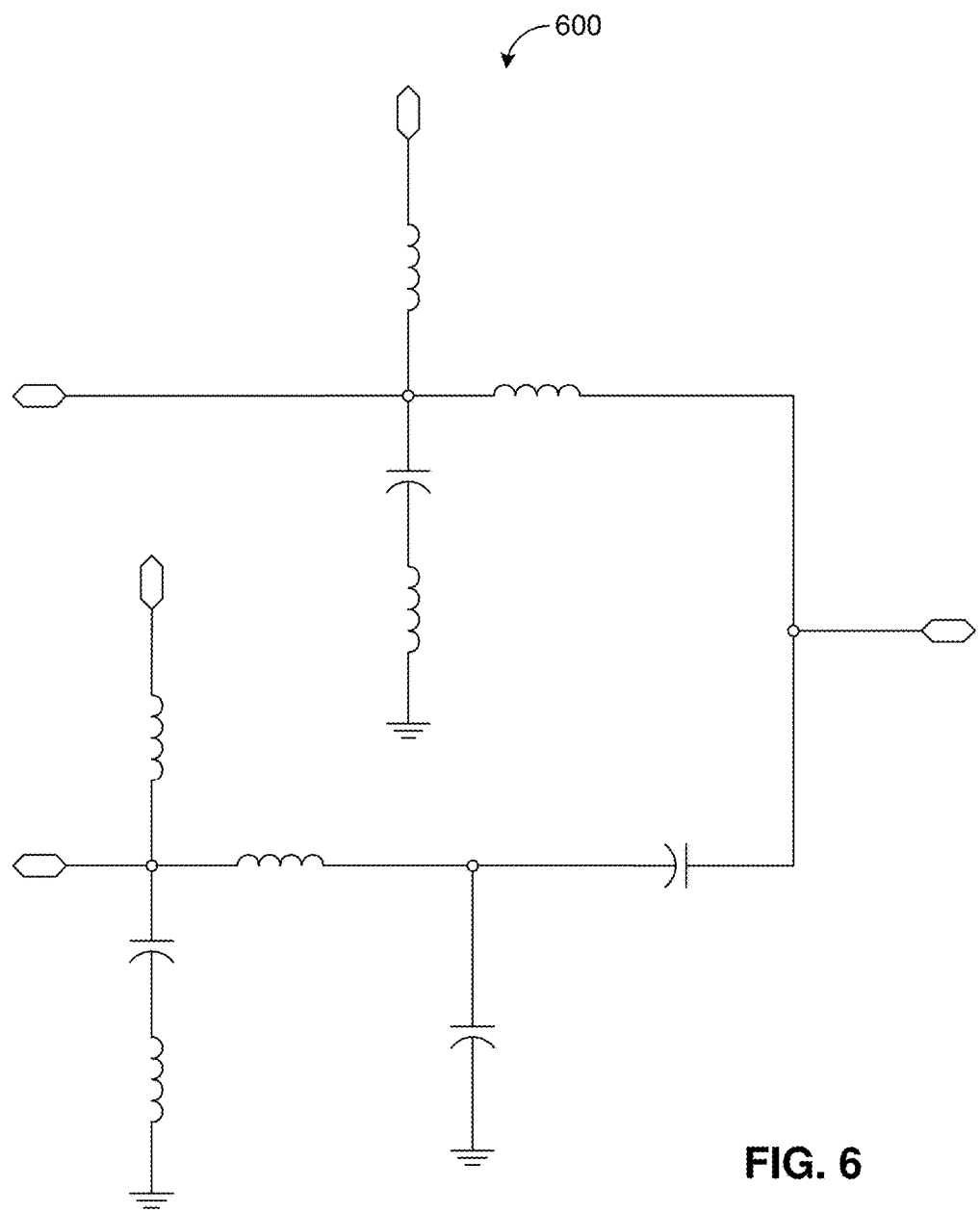
FIG. 6 shows an example of a combiner that can be utilized as the combiner of FIG. 1.

FIG. 6 shows an example of a combiner 600 that can be utilized as the combiner 144 of FIG. 1. Additional details concerning such a combiner are described in U.S. patent application Ser. No. 14/797,254, entitled SYSTEMS AND METHODS RELATED TO LINEAR AND EFFICIENT BROADBAND POWER AMPLIFIERS.

The example of FIG. 6 can be implemented as an SMT circuit having broadband capability. In some embodiments, such a combiner can include power combining and dynamic load pulling functionalities implemented with use of a lumped balun.

Figure 7:
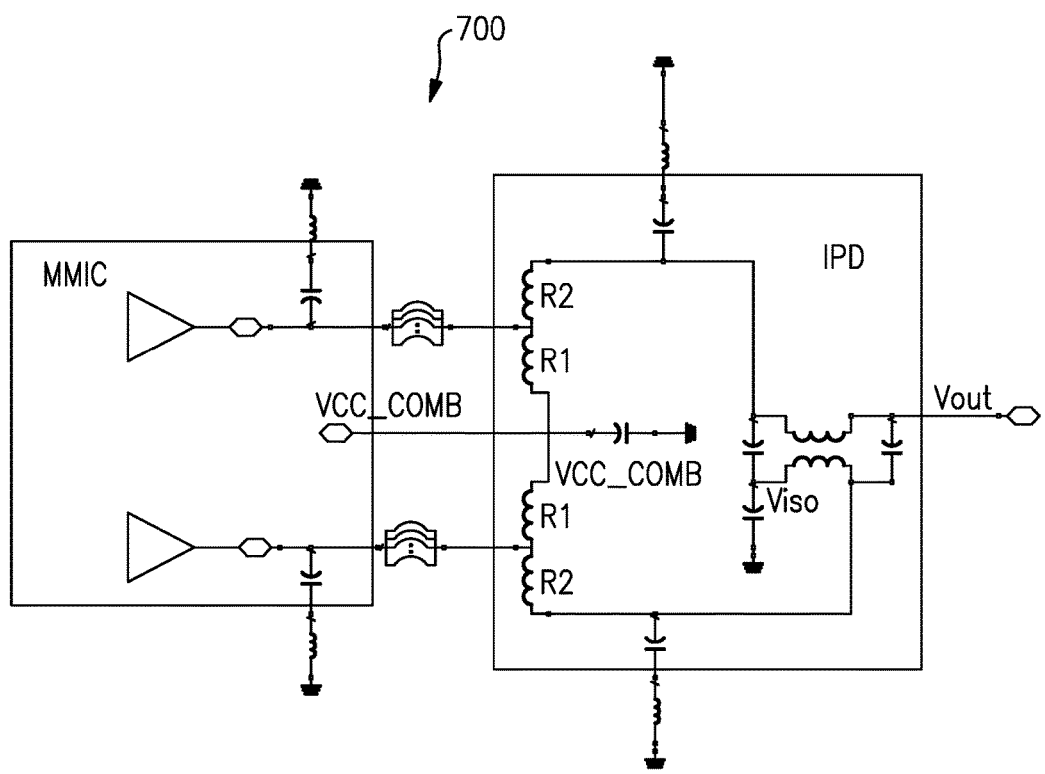
FIG. 7 shows another example of a combiner that can be utilized as the combiner of FIG. 1.

FIG. 7 shows another example of a combiner 700 that can be utilized as the combiner 144 of FIG. 1. Additional details concerning such a combiner are described in U.S. patent application Ser. No. 14/797,261, entitled CIRCUITS, DEVICES AND METHODS RELATED TO COMBINERS FOR DOHERTY POWER AMPLIFIERS.

The example of FIG. 7 can be implemented as an IPD having broadband capability. In some embodiments, such a combiner can include power combining and dynamic load pulling functionalities implemented with use of a semi-lumped 90 degree hybrid configuration.

Referring to FIG. 1, in some embodiments, each of the driver stage 116 and the output stage 120 of the carrier amplifier 114 can be configured to operate in a Class AB mode. Further, each of the driver stage 136 and the output stage 140 of the peaking amplifier 134 can be configured to operate in a Class B mode. For such configurations, bias circuits such as those shown in FIGS. 9 and 10 can be utilized to bias the stages of the carrier amplifier 114 and peaking amplifier 134, respectively. Thus, the carrier amplifier 114 and the peaking amplifier 134 may operate in different biasing modes. Further, for each amplifier 114, 134, each stage (116, 120 and 136, 140) may operate in different biasing modes. The different biasing modes can include Class A, Class B, Class Aft Class C, Class D, Class F, Class G, Class I, Class S, Class T, or any other biasing mode.

Figure 8:
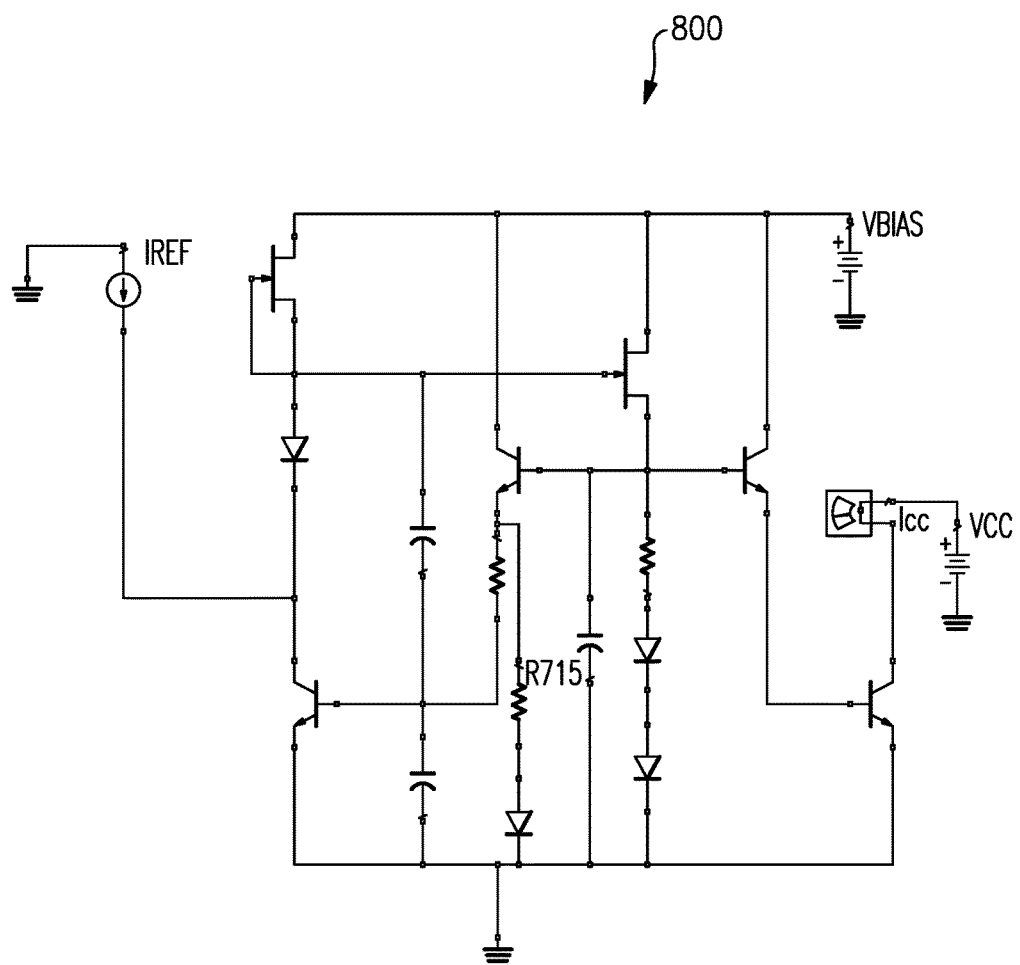
FIG. 8 shows an example of a low headroom Class AB bias circuit.

FIG. 8 shows an example of a low headroom Class AB bias circuit that can be utilized to provide a bias voltage (VBIAS) to a stage (driver 116 or output 120) of the carrier amplifier 114. Accordingly, the Class AB bias circuit can provide the biasing functionality of the bias circuit 118 and/or the bias circuit 122 of FIG. 1. Appropriate selections of transistors, diodes, capacitances and resistances can be implemented to accommodate such driver and output stage functionalities. In some embodiments, the example bias circuit of FIG. 8 can be particularly suitable for integration with external band gap references on CMOS or GaAs where low voltage headroom makes use of conventional 2×Vbe bias circuits difficult. The bias circuit of FIG. 8 can include sufficient bandwidth at baseband frequencies to support broad band signals such as LTE.

Figure 9:
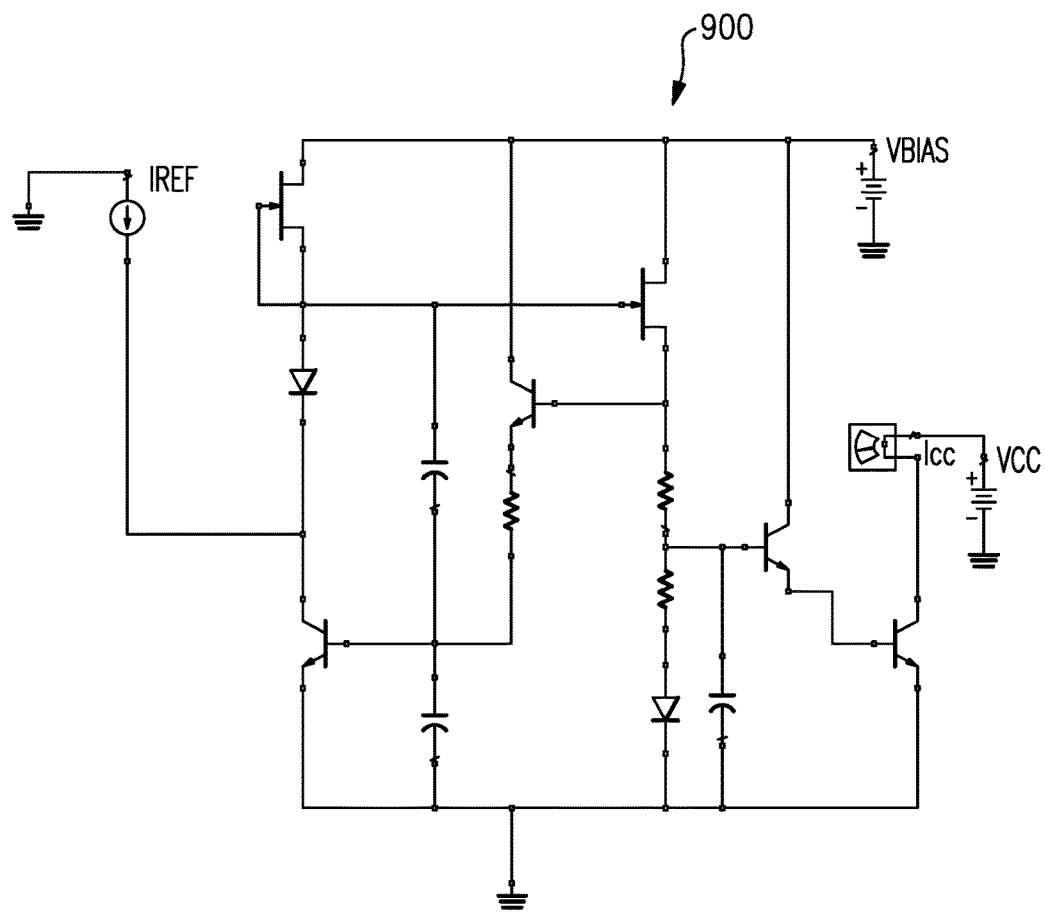
FIG. 9 shows an example of a low headroom Class B bias circuit.

FIG. 9 shows an example of a low headroom Class B bias circuit that can be utilized to provide a bias voltage (VBIAS) to a stage (driver 136 or output 140) of the peaking amplifier 134. Accordingly, the Class B bias circuit can provide the biasing functionality of the bias circuit 138 and/or the bias circuit 142 of FIG. 1. Appropriate selections of transistors, diodes, capacitances and resistances can be implemented to accommodate such driver and output stage functionalities.

Figure 10:
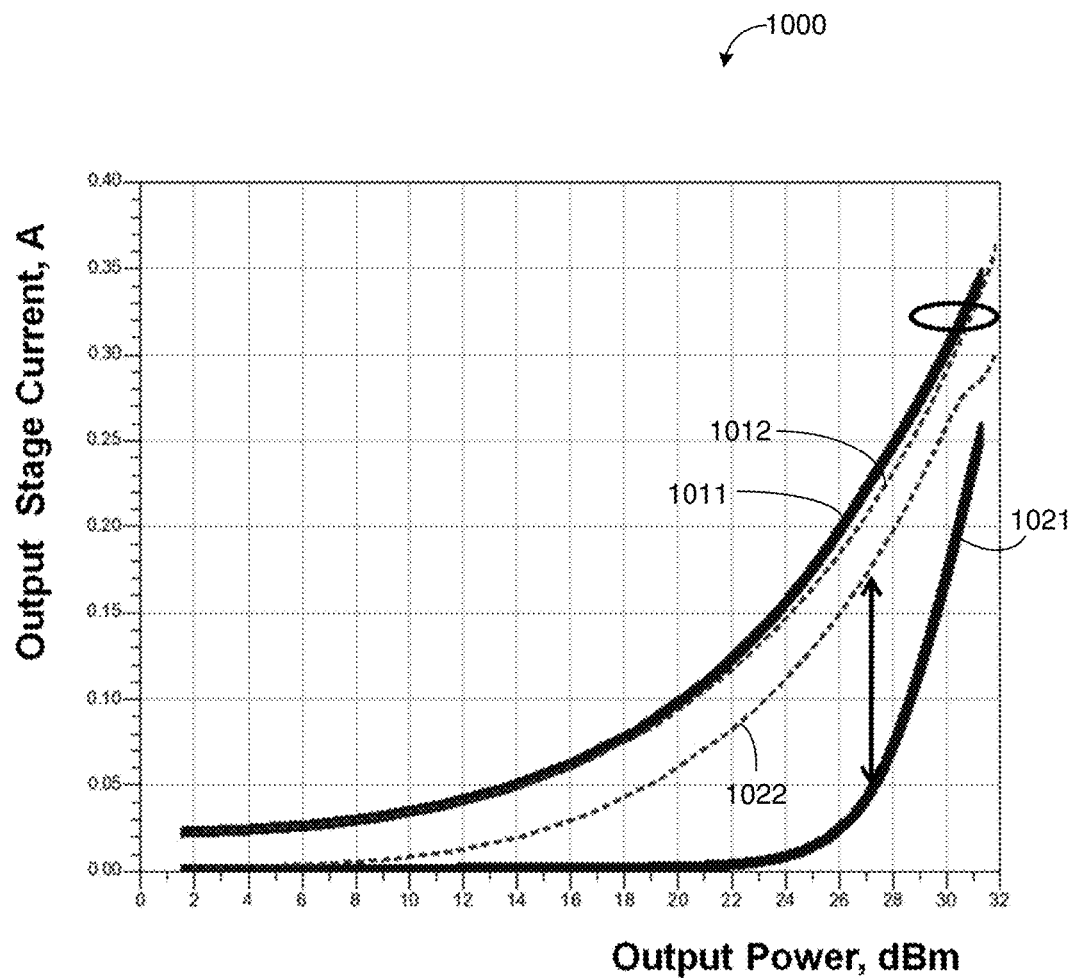
FIG. 10 shows an example of a beneficial effect of utilizing a Class B biasing of the driver stage for a peaking amplifier.

FIG. 10 shows an example of a beneficial effect of utilizing a Class B biasing of the driver stage for the peaking amplifier (134 in FIG. 1). The graph 1000 of FIG. 10 includes plots of output stage current as a function of output power for different configurations. For the carrier amplifier, the solid line 1011 is for a configuration where each of the driver and output stages is biased in a Class B mode, while the dashed line 1011 is for a configuration with Class AB biasing of the driver stage and Class B biasing of the output stage. Similarly, for the peaking amplifier, the solid line 1021 is for a configuration where each of the driver and output stages is biased in a Class B mode, while the dashed line 1022 is for a configuration with Class AB biasing of the driver stage and Class B biasing of the output stage. As shown in FIG. 10, the use of Class B biasing in the driver stage in the peaking amplifier greatly reduces the current consumption of the output stage. However, the use of Class B biasing in the driver stage in the carrier amplifier slightly increases the current consumption of the output stage.

Figure 11:
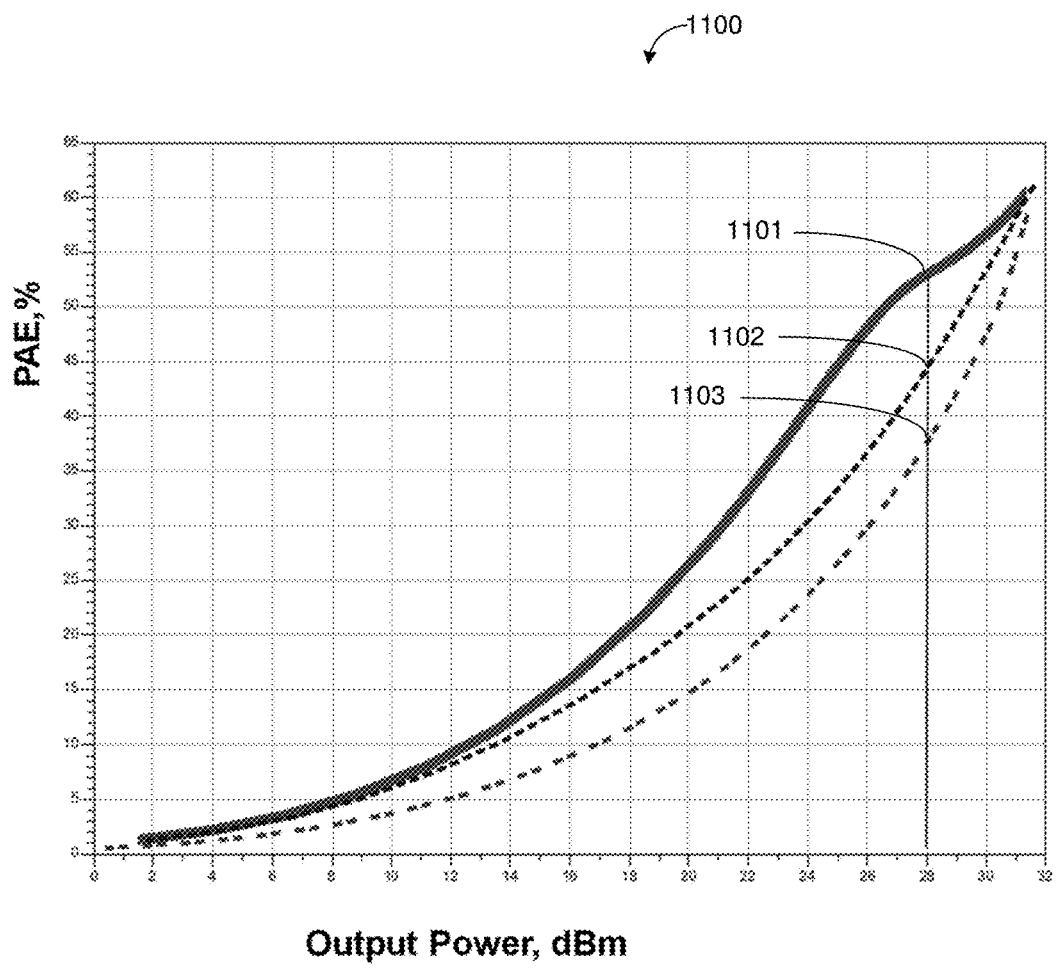
FIG. 11 shows another example of a beneficial effect of utilizing a Class B biasing of the driver stage for a peaking amplifier.

FIG. 11 shows an example of a beneficial effect of utilizing a Class B biasing of the driver stage for the peaking amplifier (134 in FIG. 1). The graph 1100 of FIG. 11 includes plots of power-added efficiency (PAE) as a function of output power for different configurations. The solid line 1101 is for a configuration where each of the driver and output stages of the peaking amplifier is biased in a Class B mode. The dashed line 1102 is for a configuration where the driver stage is biased in a Class AB mode, and the output stage is biased in a Class B mode. The dash-dash line 1103 is for an equivalent non-Doherty amplifier biased in a Class AB mode. As shown in FIG. 11, the use of Class B biasing in the driver stage in the peaking amplifier increases the PAE performance significantly.

Figure 12:
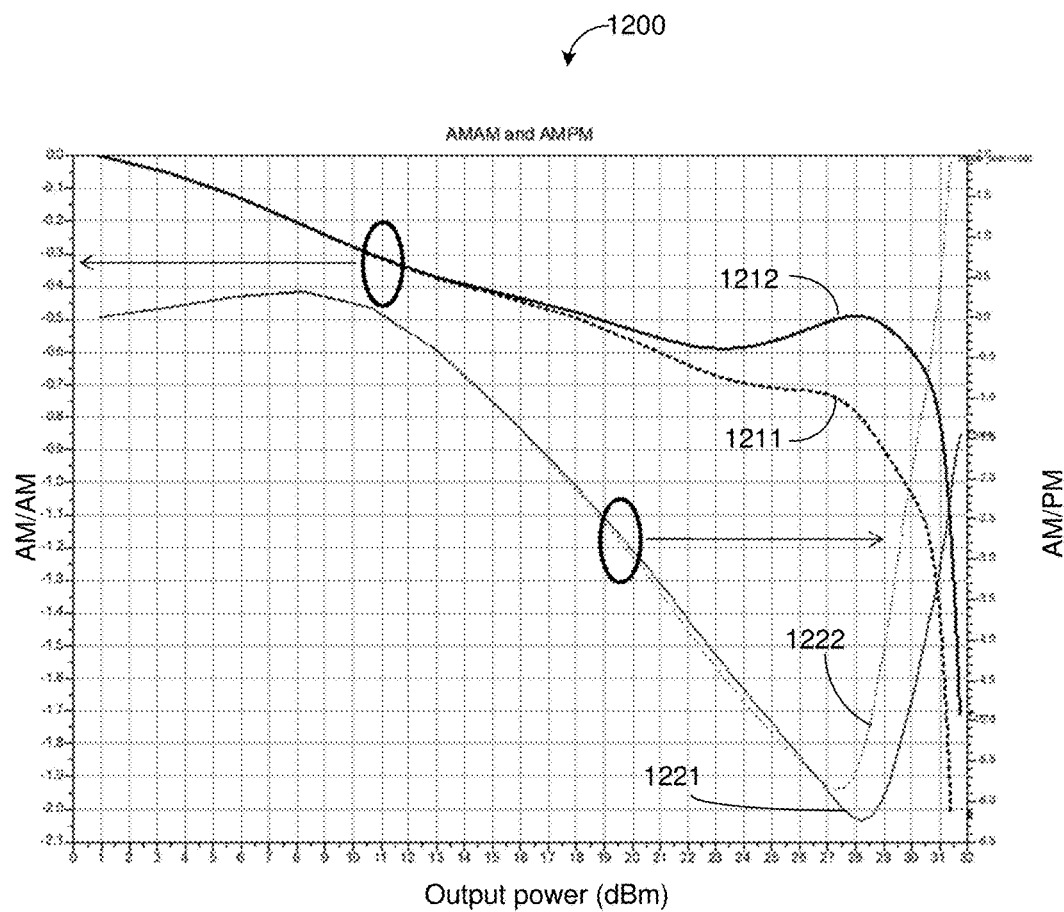
FIG. 12 shows an example of linearization effect that can be obtained by introducing a phase shift between the RF signals associated with carrier amplification and peaking amplification.

FIG. 12 shows an example of linearization effect that can be obtained by introducing a phase shift between the RF signals associated with the carrier amplification and peaking amplification. Such a phase shift can be introduced by, for example, the phase shift component 132 of FIG. 1. The graph 1200 of FIG. 12 includes plots of AM/AM (left vertical axis) and AM/PM (right vertical axis) as a function of output power. For the AM/AM plots 1211, 1212, FIG. 12 shows that the curve corresponding to a configuration with a phase shift has less AM/AM distortion, especially at higher output power, than a configuration without phase shift. Similarly, for the AM/PM plots 1221, 1222, FIG. 12 shows that the curve corresponding to a configuration with a phase shift has less AM/PM distortion, especially at higher output power, than a configuration without phase shift.

Figure 13:
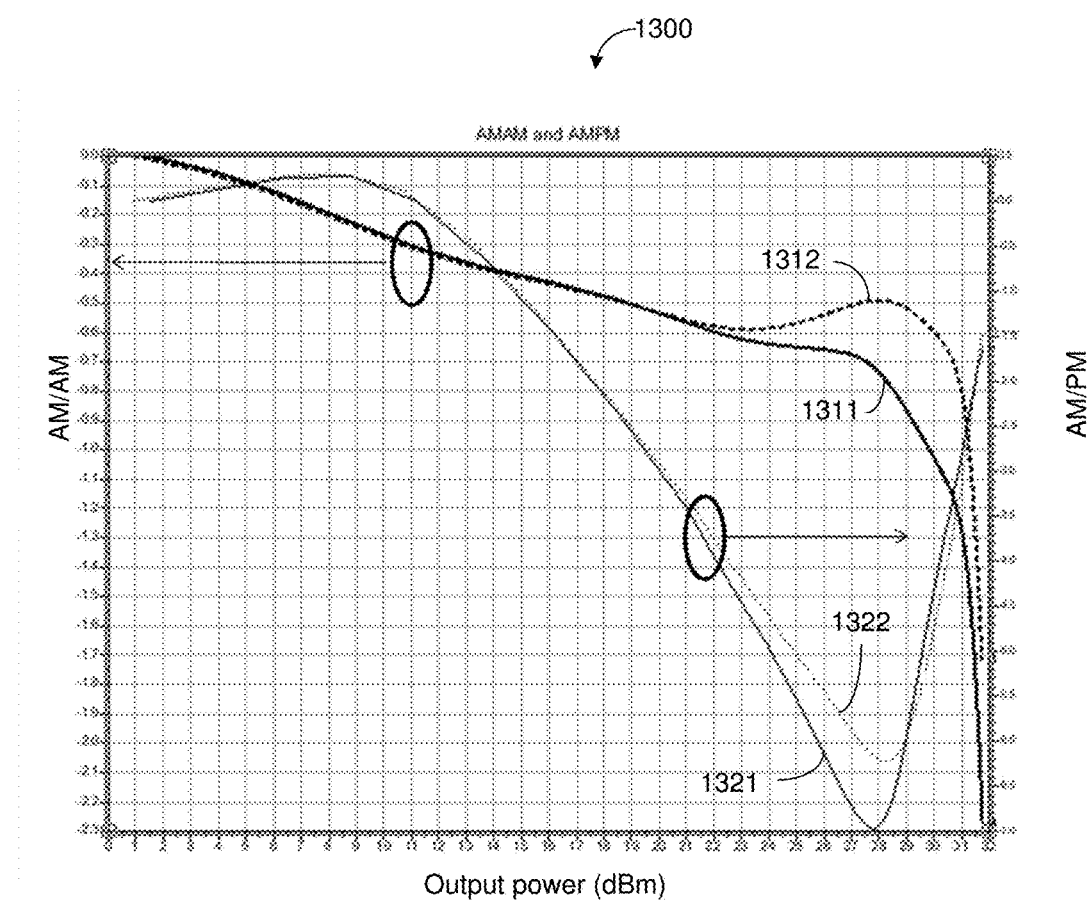
FIG. 13 shows an example of linearization effect that can be obtained by introducing an uneven power split between the RF signals associated with carrier amplification and peaking amplification.

As described herein, power split into the carrier amplification path and the peaking amplification path can be different. FIG. 13 shows an example of linearization effect that can be obtained by introducing such an uneven power split between the RF signals associated with the carrier amplification and peaking amplification. Such an uneven power split can be introduced by or be facilitated by, for example, the attenuator component 112 of FIG. 1. The graph 1300 of FIG. 13 includes plots of AM/AM (left vertical axis) and AM/PM (right vertical axis) as a function of output power. For the AM/AM plots 1311, 1312, FIG. 13 shows that the curve corresponding to a configuration with an uneven power split has less AM/AM distortion, especially at higher output power, than a configuration with an even power split configuration. Similarly, for the AM/PM plots 1321, 1322, FIG. 13 shows that the curve corresponding to a configuration with an uneven power split has less AM/PM distortion, especially at mid to higher output power, than a configuration with an even power split configuration.

Figure 14:
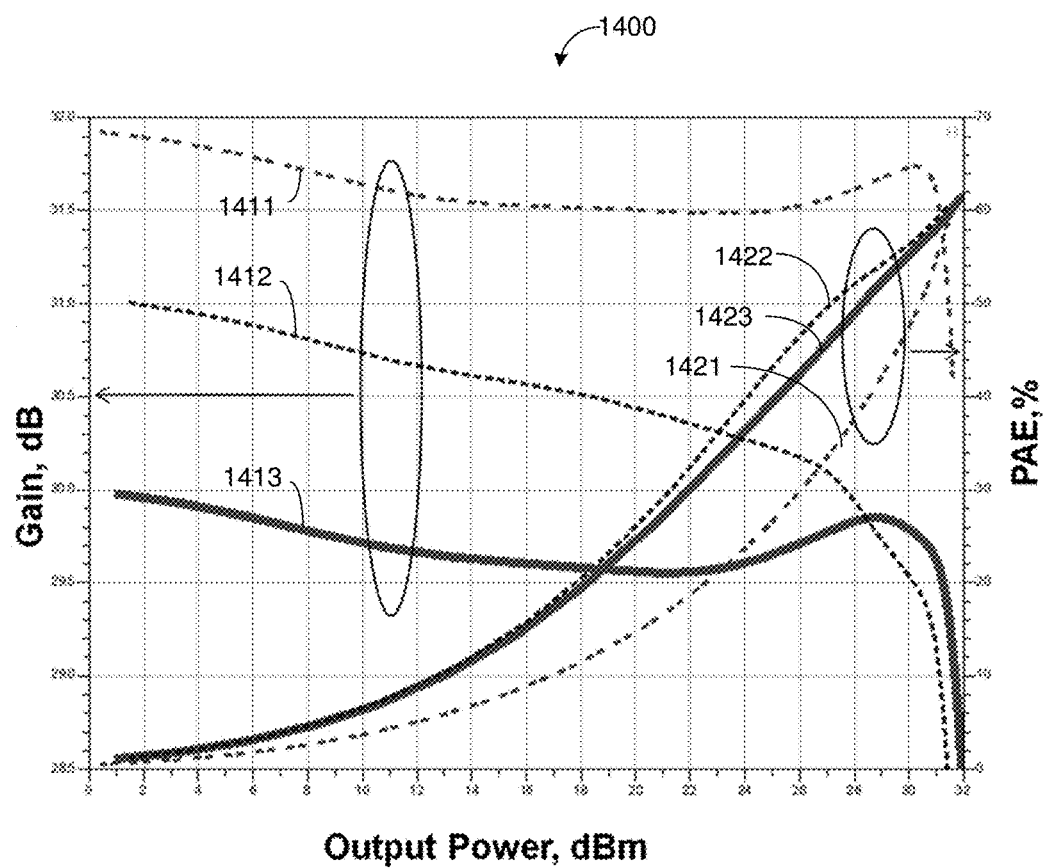
FIG. 14 shows an example of combined linearization effect that can be obtained by a combination of the phase shift and uneven power split.

FIG. 14 shows an example of combined linearization effect that can be obtained by a combination of the foregoing phase shift and uneven power split features described in reference to FIGS. 12 and 13. The graph 1400 of FIG. 14 includes plots of gain (left vertical axis) and PAE (right vertical axis) as a function of output power. In particular, line 1411 shows the gain for a non-Doherty amplifier, line 1412 shows the gain for a Doherty amplifier without phase shift and even power split, and line 1413 shows the gain for Doherty amplifier with phase shift and uneven power split. Similarly, line 1421 shows the PAE for a non-Doherty amplifier, line 1412 shows the PAE for a Doherty amplifier without phase shift and even power split, and line 1413 shows the PAE for Doherty amplifier with phase shift and uneven power split.

FIG. 14 shows that the linear load modulated amplifier (Doherty PA with phase shift and uneven power split) has a gain compression curve that is very similar to that of a non-Doherty PA (e.g., Class AB/F amplifier). FIG. 14 also shows that the PAE of the linear load modulated amplifier (Doherty PA with phase shift and uneven power split) is only slightly less (e.g., about 3% less at higher output power) than that of a classic non-linear Doherty amplifier (Doherty PA with no linearization).

Figure 15:
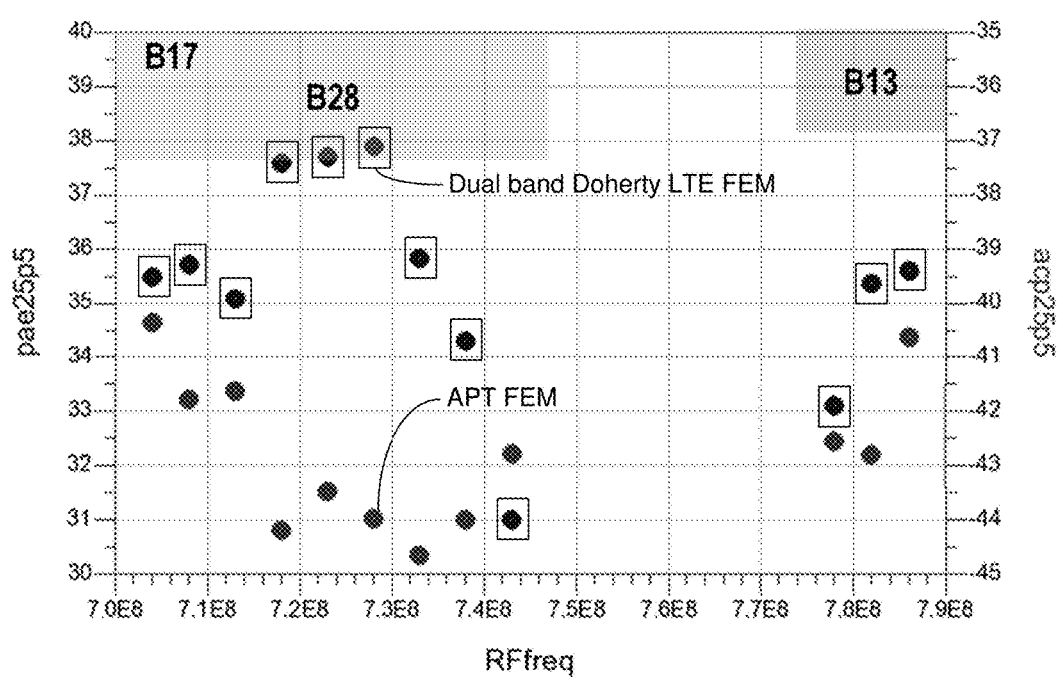
FIG. 15 shows example plots of power-added efficiency (PAE) and adjacent channel power (ACP) at various operating frequencies for a front-end module (FEM).

FIG. 15 shows plots of PAE (left vertical axis) and adjacent channel power (ACP) (right vertical axis) at various operating frequencies for a front-end module (FEM) having a dual-band Doherty PA configured for LTE operation, and an FEM having an average power tracking (APT) PA. FIG. 15 shows that the PAE is generally higher, and the magnitude of ACP is generally lower, for the Doherty PA than the APT PA. In the example shown, the improvement is about 10%.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 16:
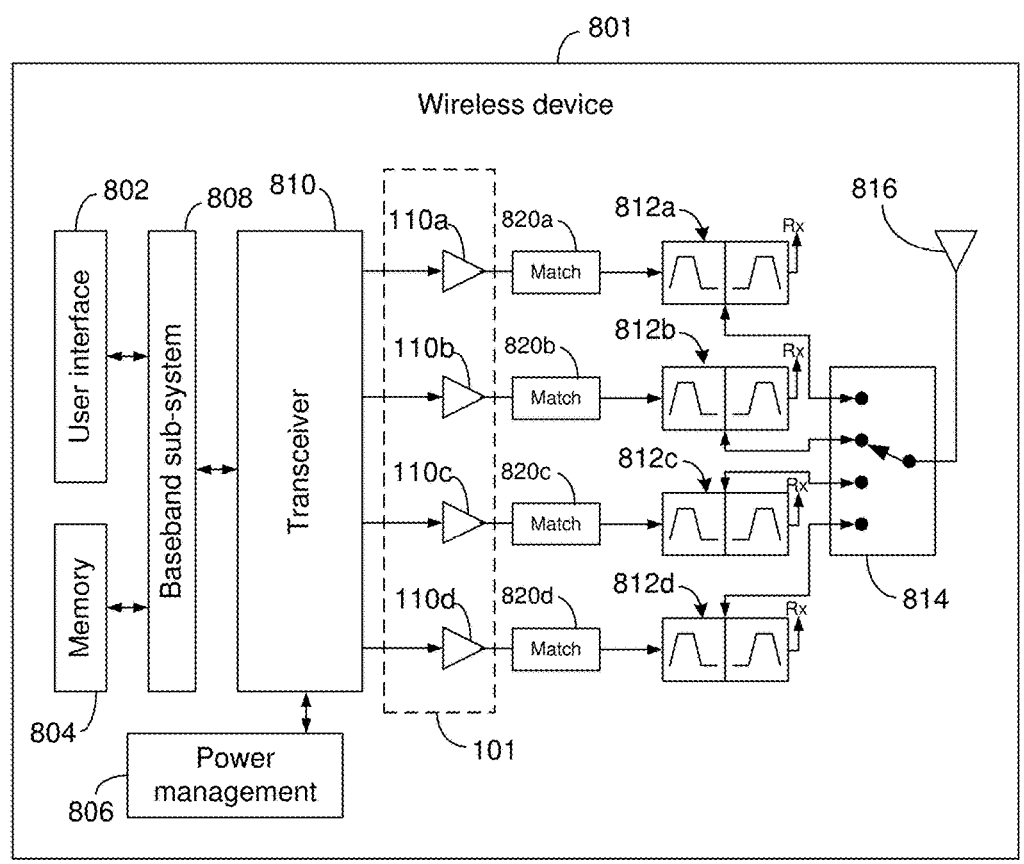
FIG. 16 depicts a wireless device having one or more features described herein.

FIG. 16 schematically depicts an example wireless device 801 having one or more advantageous features described herein. In the example, one or more PAs 110a-110d collectively indicated as a PA architecture 101 can include one or more features as described herein. Such PAs can facilitate, for example, multi-band operation of the wireless device 801.

The PAs 110a-110d can receive their respective RF signals from a transceiver 810 that can be configured and operated to generate RF signals to be amplified and transmitted, and to process received signals. The transceiver 810 is shown to interact with a baseband sub-system 808 that is configured to provide conversion between data and/or voice signals suitable for a user and RF signals suitable for the transceiver 810. The transceiver 810 is also shown to be connected to a power management component 806 that is configured to manage power for the operation of the wireless device 801. Such power management can also control operations of the baseband sub-system 808 and the PAs 110a-110d.

The baseband sub-system 808 is shown to be connected to a user interface 802 to facilitate various input and output of voice and/or data provided to and received from the user. The baseband sub-system 808 can also be connected to a memory 404 that is configured to store data and/or instructions to facilitate the operation of the wireless device 801, and/or to provide storage of information for the user.

In the example wireless device 801, outputs of the PAs 110a-110d are shown to be matched (via match circuits 820a-820d) and routed to an antenna 816 via their respective duplexers 812a-812d and a band-selection switch 814. The band-selection switch 814 can be configured to allow selection of an operating band. In some embodiments, each duplexer 812 can allow transmit and receive operations to be performed simultaneously using a common antenna (e.g., 816). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier (PA) system comprising:
a divider configured to receive an input signal and to split the input signal into a first portion and a second portion;
an attenuator configured to receive the first portion and to attenuate the first portion so that the first portion and the second portion have different powers;
a phase shift component configured to shift a phase of the second portion so that the first portion and the second portion have different phases;
a Doherty amplifier circuit including a carrier amplifier configured to amplify the attenuated first portion to yield an amplified first portion and a peaking amplifier configured to amplify the phase-shifted second portion to yield an amplified second portion, the carrier amplifier having a driver stage configured to operate in a Class AB biasing mode and an output stage configured to operate in a Class B biasing mode, the peaking amplifier having a driver stage configured to operate in a Class B biasing mode and an output stage configured to operate in a Class B biasing mode.

2. The PA system of claim 1 further comprising a combiner configured to receive the amplified first portion, to receive the amplified second portion, and to combine the amplified first portion and the amplified second portion to yield an amplified output signal.

3. The PA system of claim 1 further comprising a pre-driver amplifier configured to amplify a pre-driver signal to yield the input signal for the divider.

4. The PA system of claim 1 wherein the first portion and second portion are out-of-phase by between 10 degrees and 20 degrees.

5. The PA system of claim 1 wherein the different phases reduce at least one of AM/AM distortion or AM/PM distortion as compared to equal phases.

6. The PA system of claim 1 wherein the different powers reduce at least one of AM/AM distortion or AM/PM distortion as compared to equal powers.

7. The PA system of claim 1 wherein the Class B biasing mode increases the PAE of the peaking amplifier as compared to a Class AB biasing mode.

8. The PA system of claim 1 further comprising a carrier driver bias circuit configured to bias the driver stage of the carrier amplifier to operate in the Class AB biasing mode.

9. The PA system of claim 8 further comprising a carrier output bias circuit configured to bias the output stage of the carrier amplifier to operate in the Class B biasing mode.

10. The PA system of claim 9 further comprising a peaking driver bias circuit configured to bias the driver stage of the peaking amplifier to operate in the Class B biasing mode.

11. The PA system of claim 10 further comprising a peaking output bias circuit configured to bias the output stage of the peaking amplifier to operate in the Class B biasing mode.

12. A power amplifier (PA) module comprising:
a packaging substrate configured to receive a plurality of components; and
a PA system implemented on the packaging substrate, the PA system including a divider configured to receive an input signal and to split the input signal into a first portion and a second portion, the PA system also including an attenuator configured to receive the first portion and to attenuate the first portion so that the first portion and the second portion have different powers, the PA system also including a phase shift component configured to shift a phase of the second portion so that the first portion and the second portion have different phases, the PA system also including a Doherty amplifier circuit including a carrier amplifier configured to amplify the attenuated first portion to yield an amplified first portion and a peaking amplifier configured to amplify the phase-shifted second portion to yield an amplified second portion, the carrier amplifier having a driver stage configured to operate in a Class AB biasing mode and an output stage configured to operate in a Class B biasing mode, the peaking amplifier having a driver stage configured to operate in a Class B biasing mode and an output stage configured to operate in a Class B biasing mode.

13. The PA module of claim 12 wherein the divider, the attenuator, and the phase shift component are implemented as an integrated passive device.

14. The PA module of claim 12 wherein the divider, the attenuator, and the phase shift component are implemented on a single GaAs die.

15. The PA module of claim 12 wherein the PA system further includes a combiner configured to receive the amplified first portion, to receive the amplified second portion, and to combine the amplified first portion and the amplified second portion to yield an amplified output signal.

16. The PA module of claim 15 wherein the combiner is implemented as an integrated passive device.

17. The PA module of claim 15 wherein the combiner is implemented on a single GaAs die.

18. A wireless device comprising:
a transceiver configured to generate a radio-frequency (RF) signal;
a power amplifier (PA) module in communication with the transceiver, the PA module including a divider configured to receive an input signal and to split the input signal into a first portion and a second portion, the PA module also including an attenuator configured to receive the first portion and to attenuate the first portion so that the first portion and the second portion have different powers, the PA module also including a phase shift component configured to shift a phase of the second portion so that the first portion and the second portion have different phases, the PA module also including a Doherty amplifier circuit including a carrier amplifier configured to amplify the attenuated first portion to yield an amplified first portion and a peaking amplifier configured to amplify the phase-shifted second portion to yield an amplified second portion, the carrier amplifier having a driver stage configured to operate in a Class AB biasing mode and an output stage configured to operate in a Class B biasing mode, the peaking amplifier having a driver stage configured to operate in a Class B biasing mode and an output stage configured to operate in a Class B biasing mode.

19. The wireless device of claim 18 wherein the PA module further includes a combiner configured to receive the amplified first portion, to receive the amplified second portion, and to combine the amplified first portion and the amplified second portion to yield an amplified output signal.

20. The wireless device of claim 19 further including an antenna coupled to the PA module and configured to receive the amplified output signal from the combiner.

* * * * *